(12) United States Patent
Munter

(10) Patent No.: US 9,805,730 B2
(45) Date of Patent: Oct. 31, 2017

(54) DYNAMIC DECODING OF COMMUNICATION BETWEEN CARD READER AND PORTABLE DEVICE

(71) Applicant: iZettle Merchant Services AB, Stockholm (SE)

(72) Inventor: Fredrik Munter, Stockholm (SE)

(73) Assignee: IZETTLE MERCHANT SERVICES AB, Stockholm (SE)

( * ) Notice: Subject to any disclaimer, the term of this patent is extended or adjusted under 35 U.S.C. 154(b) by 18 days.

(21) Appl. No.: 14/458,389

(22) Filed: Aug. 13, 2014

(65) Prior Publication Data

US 2015/0051914 A1 Feb. 19, 2015

Related U.S. Application Data

(60) Provisional application No. 61/866,656, filed on Aug. 16, 2013.

(30) Foreign Application Priority Data

Nov. 29, 2013 (EP) .................................... 13195098

(51) Int. Cl.
*H03M 5/12* (2006.01)
*G10L 19/02* (2013.01)
(Continued)

(52) U.S. Cl.
CPC .......... *G10L 19/02* (2013.01); *G06F 11/1004* (2013.01); *H03M 5/12* (2013.01);
(Continued)

(58) Field of Classification Search
CPC ... G07F 7/0873; G07F 7/0886; G06K 7/0004; G06K 7/00; G06K 7/089; H04M 2250/14;
(Continued)

(56) References Cited

U.S. PATENT DOCUMENTS 6,370,212 B1 * 4/2002 Nakai ..................... H03M 5/12
341/70
8,201,014 B2 * 6/2012 Lam ....................... G10L 19/10
348/484

(Continued)

OTHER PUBLICATIONS

Extended European Search Report in corresponding European Patent Application No. 13195098.2 dated May 8, 2015.
(Continued)

*Primary Examiner* — Christopher Stanford
(74) *Attorney, Agent, or Firm* — Renner, Otto, Boisselle & Sklar, LLP; Grant Steyer

(57) ABSTRACT

The proposed technology generally relates the field of data transmission, in particular it relates to decoding an encoded data signal received at an audio interface of a portable electronic device, wherein the encoded data signal is encoded with an encoding scheme having an adjustable encoder clock frequency. The proposed method comprises pre-processing the received encoded data signal; scanning the received encoded data signal for a known start sequence and when a known start sequence is successfully detected then calculating an actual frequency based on the detected start sequence; interpreting, a data block succeeding the start sequence using the assessed actual frequency; and assessing whether to request adjustment of the adjustable encoder clock frequency based on the scanning and/or the interpretation. The proposed technology relates to a method performed in a portable communications device well as a corresponding device and computer program.

17 Claims, 4 Drawing Sheets

(51) Int. Cl.
*G06F 11/10* (2006.01)
*H03M 5/06* (2006.01)
*H03M 5/00* (2006.01)
*H03M 5/02* (2006.01)

(52) U.S. Cl.
CPC ............... *H03M 5/00* (2013.01); *H03M 5/02* (2013.01); *H03M 5/06* (2013.01)

(58) Field of Classification Search
CPC ............ H03M 5/12; H03M 5/06; H03M 5/02; H03M 5/00; G10L 19/02
See application file for complete search history.

(56) References Cited

U.S. PATENT DOCUMENTS

| | | | |
|---|---|---|---|
| 9,271,099 B1* | 2/2016 | Sun | ............... A61B 5/0402 |
| 2012/0118956 A1 | 5/2012 | Lamba et al. | |
| 2013/0058419 A1* | 3/2013 | Ye | ............... H04N 21/43637 375/240.25 |
| 2013/0087614 A1 | 4/2013 | Limtao | |
| 2014/0203082 A1* | 7/2014 | Huh | ............... G06K 7/0004 235/440 |
| 2014/0351359 A1* | 11/2014 | Grocutt | ............... G06F 1/12 709/209 |

OTHER PUBLICATIONS

Ye-Sheng Kuo et al., "Hijacking power and bandwidth from the mobile phone's audio interface", Proceedings of the First ACM Symposium on Computing for Development, Dec. 17, 2010 (Dec. 17, 2010), pp. 1-10, XP055116865, DOI: 10.1145/1926180. 1926210, ISBN: 978-1-45-030473-3 *the whole document*.

* cited by examiner

DYNAMIC DECODING OF COMMUNICATION BETWEEN CARD READER AND PORTABLE DEVICE

CROSS-REFERENCE TO RELATED APPLICATIONS

This application claims the benefit of U.S. Provisional Patent Application Ser. No. 61/866,656, filed Aug. 16, 2013 and EP Patent Application Serial No. 13195098.2, filed Nov. 29, 2013, the entire disclosures of which are hereby incorporated by reference.

TECHNICAL FIELD

The disclosure relates to portable electronic devices and to using the audio interface of a portable electronic device for data reception. In particular the disclosure provides an improved method to decode an encoded data signal received at the audio interface of a portable communication device e.g. for transfer of data deriving from credit card readers.

BACKGROUND

Using the audio plug in portable electronic devices, such as smartphones or tablets, for data transmission to and from external devices is commonly known. For example, patent application US2013087614 discloses magnetic stripe readers that communicate data via an audio interface for receiving data from a magnetic card reader. In US2013087614 filtering is performed at the card reader side.

However, audio interfaces, typically 3.5 mm female stereo/microphone sockets and corresponding hardware and software, in portable electronic devices are generally optimized for the transfer of voice communication and not for data transformed to audio signals. The audio interfaces may comprise hardware or software for optimizing the sound experience or quality. However, when using audio interfaces for other purposes than audio, such as for data communication, this optimization may cause a problem, because this optimization makes the data difficult to interpret.

Today, one way to encode data of this kind is to use Manchester Encoding. When using Manchester encoding the data signal changes from a low level to a high level in the middle of the bit period when a binary "0" is transmitted (changing input "0" to "01") and, conversely, changes from a high level to a low level in the middle of the bit period when a binary "1" is transmitted (changing input "1" to "10"). In other words, it is a coding format that divides a single bit period into a front cell and a rear cell, expressing a logical value "0" when the front cell is at a low level and the rear cell is at a high level, and expressing a logical value "1" when the front cell is at a high level and the rear cell is at a low level. It can also be said that the Manchester encoding converts a single input bit into two bits (or transmits a single bit in two pulses (2 T)), with the communication rate being halved by doubling the bandwidth, but the direct current component being eliminated from the transmitted signal.

FIG. 4 shows how a signal may be distorted by the optimizations of the audio interface. The upper signal 40a shown in FIG. 4 discloses a Manchester coded signal transmitted from a card reader device. The middle signal 40b shows the received signal, i.e. the raw data of the sound buffer after being processed by the hardware and software of the audio interface. In this example the distortion is so severe that a traditional decoder may fail to decode the signal correctly.

Hence, a great number of portable electronic device models are rendered non-compatible to receive data such as Manchester encoded data on the audio interface, due to failure to decode the data, since the audio interface comprises e.g. amplifiers, filters, A/D converters and other software and hardware components, which are optimized for audio or voice communication.

SUMMARY

The disclosure overcomes at least some of the above mentioned problems and makes it possible use a great number of different portable electronic devices together with accessories like e.g. mobile card readers, communicating over the audio interface. This is possible by using the proposed method for dynamically decoding an audio stream, wherein e.g. the clock frequency used by the decoder and the transmission frequency of the encoder are dynamically updated.

The proposed technique discloses a method, performed in a portable electronic device, of decoding an encoded data signal received at an audio interface of the portable electronic device, wherein the encoded data signal is encoded with an encoding scheme having an adjustable encoder clock frequency. The method comprises preprocessing the received encoded data signal and scanning the received encoded data signal for a known start sequence. The preprocessing implies e.g. smoothing the signal. It may also imply providing portable electronic device specific rules in order to overcome specific problems.

When a known start sequence is successfully detected, then the method further comprises calculating an actual frequency based on the detected start sequence, interpreting, a data block succeeding the start sequence using the assessed actual frequency and assessing whether to request adjustment of the adjustable encoder clock frequency based on the scanning and/or the interpretation. The proposed technique makes it possible to use the same device or accessory communicating over the audio interface together with different portable electronic devices because the method mitigates the effects caused by the audio interface of the portable electronic device. The method facilitates or even enables interpretation of a data signal received over the audio interface. No adaptations are needed within the portable electronic device, because the method may be provided in a software application, which may be downloaded into the portable electronic device.

Hence, the hardware may be used for several portable electronic devices. Furthermore, the same software application may also be used in different portable electronic devices having different audio interfaces, e.g. different smartphone models. It is also possible to add functionality, further improving the decoding method, to the decoding software application if new portable electronic devices, e.g. smartphones are launched. Furthermore, the adjustable encoder clock frequency makes it possible to have a higher average throughput. Hence, the user experience is improved.

According to one aspect the method further comprises requesting an initial adjustable encoder clock frequency. This value may be a generic value or a portable device specific value retrieved e.g. in a lookup table.

According to one aspect the method further comprises requesting adjustment of the adjustable encoder clock frequency. Hence, the adjustment may be a consequence of either failure to detect the known start sequence in the scanning or of a failure to interpret the encoded signal. By doing this the signal may be resent with a more favorable frequency, wherein the chance of successful decoding will increase.

According to one aspect the step of preprocessing the encoded data signal comprises smoothing the encoded data signal. By removing noise the chance of successful decoding will increase. According to one aspect the step of smoothing the signal comprises applying a moving average to the encoded signal.

According to one aspect the step of preprocessing the encoded data signal comprises determining an identity of the portable communication device and modifying the encoded data signal by applying to the encoded data signal, a set of precoding rules corresponding to the detected identity. Hence, it is possible to overcome problems caused by specific portable electronic device models where the distortion has particular properties.

According to one aspect the step of scanning the received encoded data signal comprises identifying points in time where the encoded signal crosses the zero level of the encoded data signal and detecting, a known start sequence, by analyzing the distance in time between the identified zero-level crossings. According to one aspect the method further comprises calculating for each sample, a dynamic zero level by averaging a number of previous samples of the preprocessed encoded data signal; wherein the scanning of the actual frequency of each data block is based on the calculated dynamic zero level. This makes the zero-level crossing insensitive to potential voltage offset of the signal added by the audio interface. According to one aspect the method further comprises disregarding any identified zero-level crossings that are closer than a defined distance to the previous zero crossing.

According to one aspect the method further comprises determining a starting point of each data block based on the detected known start sequence.

According to one aspect the step of requesting adjustment of the adjustable encoder clock frequency comprises requesting an encoding device to lower the adjustable encoder clock frequency if no known start sequence is detected in the data block.

According to one aspect the method further comprises verifying the correctness of the transmission by calculating a checksum. According to one aspect the step of requesting adjustment of the adjustable encoder clock frequency comprises requesting an encoding device to update the adjustable encoder clock frequency if the checksum is faulty.

According to another aspect the disclosure relates to a portable electronic device configured for decoding an encoded data signal received at an audio interface of the portable electronic device. The portable electronic device comprises an audio interface configured for receiving and encoded data signal encoded with an adjustable encoder clock frequency and processing circuitry. The processing circuitry is adapted to preprocess the received encoded data signal and scan the received encoded data signal for a known start sequence. When a known start sequence is successfully detected then the processing circuitry further causes the electronic device to estimate an actual frequency based on the detected start sequence, interpret, a data block succeeding the start sequence using the assessed actual frequency and assess whether to request adjustment of the adjustable encoder clock frequency based on the scanning and/or the interpretation.

According to another embodiment the disclosure relates to a computer program, comprising computer readable code which, when run on a processing circuitry of a portable electronic device in a contention based communication system, causes the portable electronic device to perform any of the aspects of the method described above.

With the above description in mind, the object of the present disclosure is to overcome at least some of the disadvantages of known technology as previously described.

DETAILED DESCRIPTION

The disclosure makes it possible to use a great number of different portable electronic devices together with accessories like e.g. mobile card readers for reading credit cards. This is enabled by using a dynamic decoding algorithm, which dynamically adapts the clock frequency of the encoder and the decoder based on the signal properties of the transmitted data. According to one aspect the algorithm further comprises computing a dynamic zero level to use when decoding the encoded data signal.

Embodiments of the present disclosure are in general directed, to decoding a Manchester encoded signal as described above in the background section. However, it must be understood that the same principle is applicable to other coding techniques facing the same problems e.g. differential Manchester coding or other Frequency/Double Frequency, F2F, encoding schemes.

Figure 1:
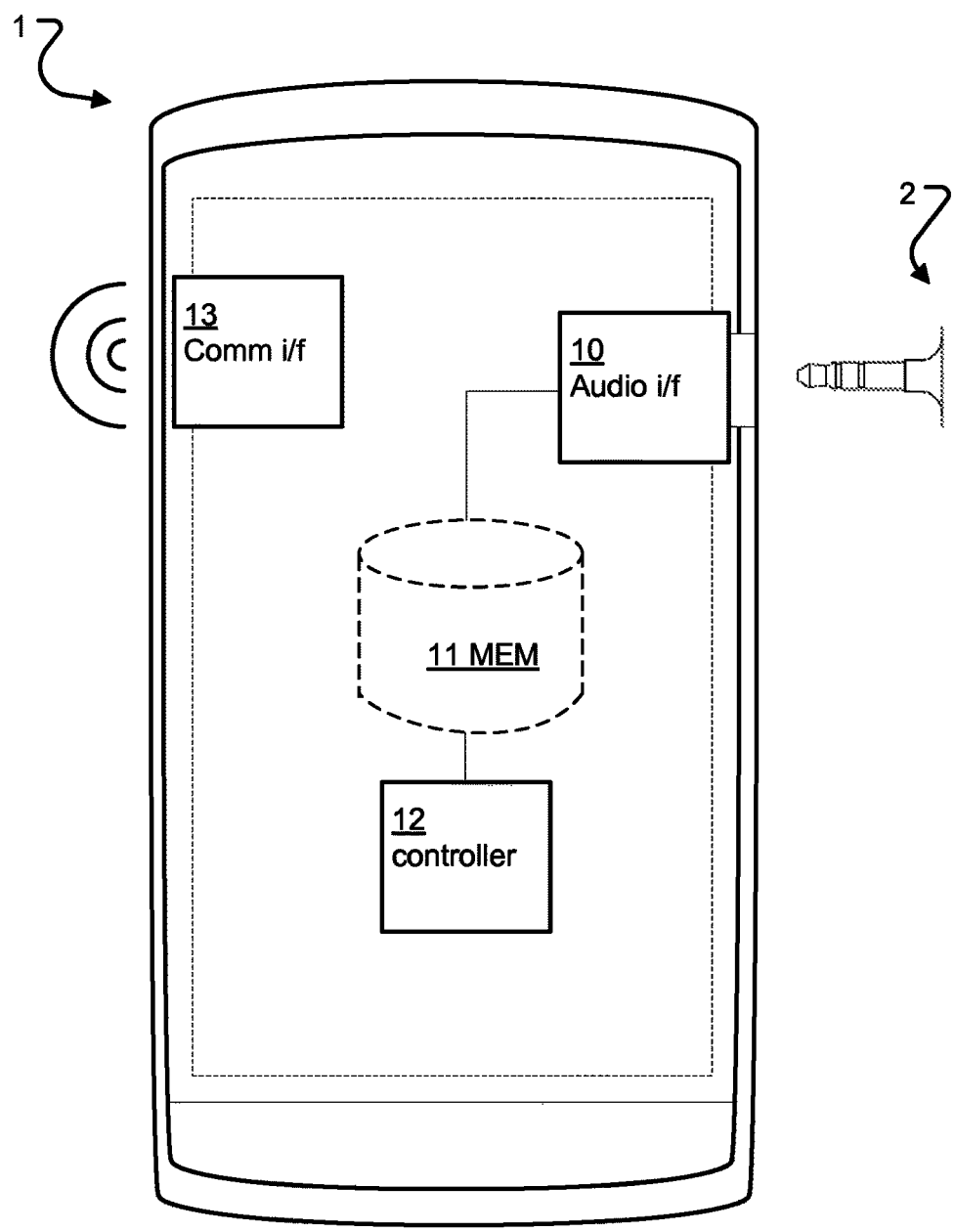
FIG. 1 discloses a block diagram of a portable electronic device, e.g. a mobile phone where the method is implemented.

The disclosure will now be described in more detail. FIG. 1 shows a portable electronic device, e.g. a mobile phone where the method is implemented. In FIG. 1 a card reader is connected to the portable electronic device 1, here a smartphone, via the audio interface 2—a 3.5 mm female stereo/microphone interface. The card reader is e.g. a card reader for executing a credit card payment as disclosed in European patent application EP2559012 A1, which is incorporated herein by reference. However, it should be noted that the disclosure is as well applicable to other phone accessories where data transmission to or from a portable electronic device is needed. In this example, a payment card has been inserted into the portable electronic device and the interaction process with the credit card has been initiated.

The audio interface of the portable electronic device receives and samples the signal provided at the audio plug interface and writes the data to a sound buffer in a memory 11 of the portable electronic device. This may be performed within the standard software of the portable electronic device and is then not a part of the disclosure. The audio interface 10 comprises an audio receiver chain, implemented in hardware and/or software, which is typically optimized for voice data. Hence, as mentioned before, the interface may not be optimal for an encoded data signal.

The portable electronic device 1 further comprises a controller or processing circuitry 12. The controller 12 is configured to execute the method according to the disclosure. The controller is typically a processing circuitry for executing computer code for executing the method. One example is that the computer code is an application, which may be downloaded from an external server that comprises computer readable instructions for executing the method. However, the method may as well be hardware implemented or a combination of hardware and software.

Figure 2:
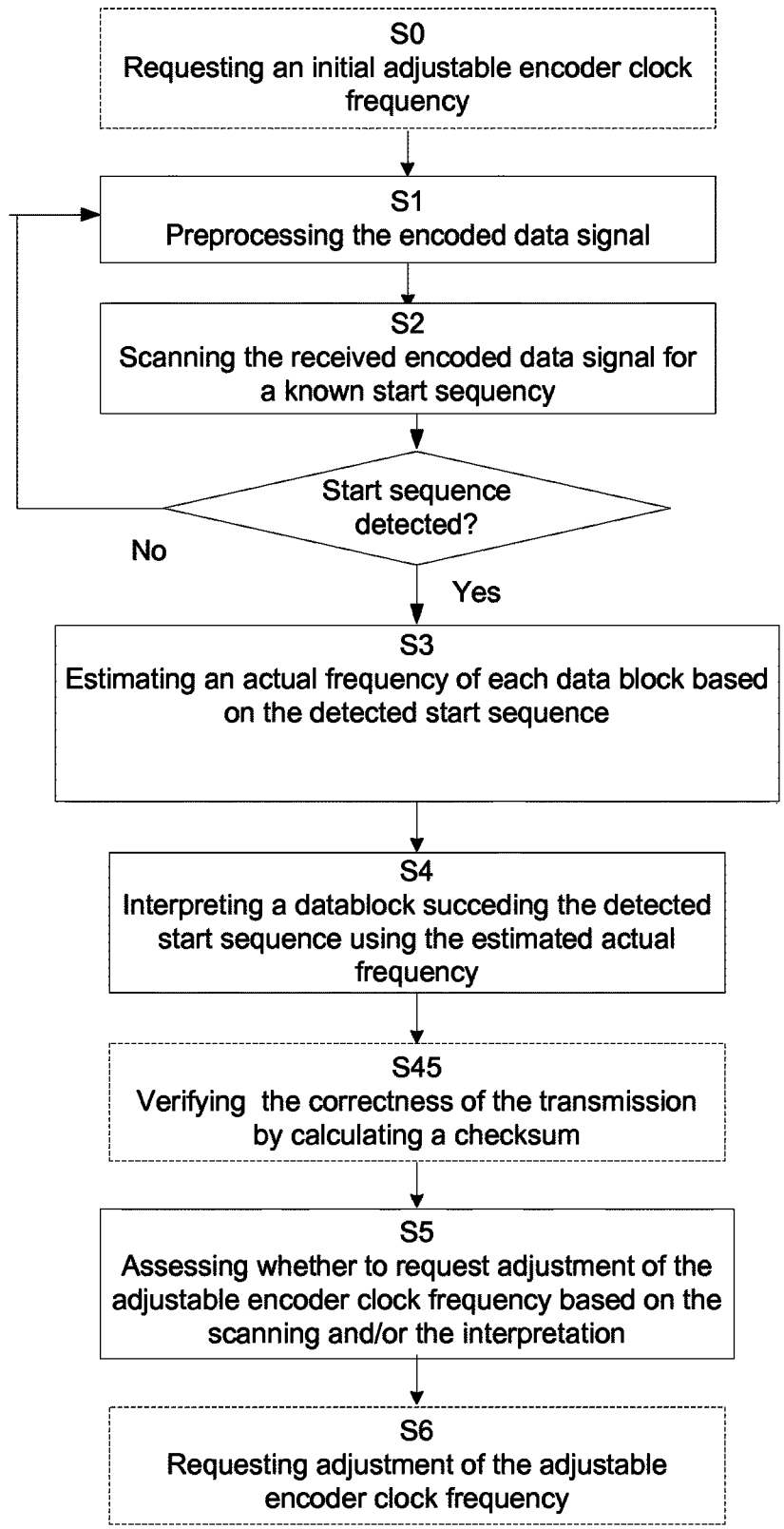
FIG. 2 discloses a flow chart of the method in a portable electronic device of decoding an encoded data signal received at an audio interface of the portable electronic device.

The method will now be described starting from FIG. 2 disclosing a method steps, performed in a portable electronic device, of decoding an encoded data signal received at an audio interface of the portable electronic device. When the described steps are not dependent on each other, these steps may be implemented in any combination.

The received encoded data signal is encoded with an encoding scheme having an adjustable encoder clock frequency. An adjustable encoder clock frequency implies that the data symbol rate of the encoded signal is adjustable. Typically the clock frequency may be adjusted by a request from the device receiving the signal. In the example of FIG. 1, this implies that the mobile phone may send a request to the card reader to adjust its frequency. The coding scheme is e.g. Manchester coding. According to one aspect of the disclosure, the encoded signal is encoded by a card reader device adapted to read a credit card.

According to one aspect the decoding method is initiated by the portable electronic device requesting S0 an initial adjustable encoder clock frequency. This implies that the portable electronic device sends a request to the card reader device to use a particular frequency. According to one example, the initial frequency is always the same, i.e. the same for different phone models. The frequency may also be device specific. For example, a certain initial frequency is selected based on phone model and version. When the initial frequency is set, the decoding starts.

In the first step the portable electronic device preprocesses S1 the received encoded data signal. According to one aspect the step of preprocessing S1 the encoded data signal comprises smoothing the encoded data signal. Smoothing implies elimination of disturbances and noise of higher frequency. According to one embodiment the step of smoothing the signal comprises applying a moving average to the encoded signal, i.e. to the signal in the sound buffer. A moving average is a type of finite impulse response filter used to analyze a set of data points by creating a series of averages of different subsets of the full data set. For a series of samples and a fixed subset size, the first element of the moving average is obtained by taking the average of the initial fixed subset of the samples. Then the subset is modified by "shifting forward"; that is, excluding the first sample of the series and including the next sample following the original subset in the series. This creates a new subset of samples, which is averaged. This process is repeated over the entire data series. The number of data points used for smoothing is dynamic and is adapted to the optimal conditions for the portable electronic device with regards taken to model and software version.

According to one aspect the step of preprocessing S1 the encoded data signal further comprises determining an identity of the portable communication device and modifying the encoded data signal by applying to the encoded data signal, a set of precoding rules corresponding to the detected identity. In order to reach device specific parameters to use in any step of the method a centralized database may be used. This is relevant in the case where the method is implemented in an application, which is downloadable in different device models. The database may comprise properties of several different models of portable electronic devices. The database may be automatically updated where after different models are used. The software application may also send audio files to the data base for use by other devices.

In the second step the portable electronic device scans S2 the received encoded data signal for a known start sequence. The encoded data signal typically comprises a known start sequence also referred to as a start sentinel. The second step implies identifying the sentinel. The start sentinel is typically repeated a number of times. By repeating the sentinel, it is possible to detect it even if the audio interface implements some kind of fade in on the signal. The sentinel length and format varies for different encoders. One may use these sentinels both for "warm-up" (start) and "cool-down" (stop) issues. A stop sentinel is useful when the electronic device's audio interface fades in/out sharp sounds. Otherwise the fade in/out may cause loss of data.

According to one aspect of this disclosure a corrupt signal may be to increase the length of the start sequence. The length may be model specific or a certain length may be requested.

When a known start sequence is successfully detected then the method comprises, in a third step S3, calculating in the portable electronic device S3 an actual frequency based on the detected start sequence. Upon successful identification of the sentinel pattern, it is possible to calculate the clock frequency of the encoded data signal in the sound buffer. This step is relevant, because inventors have realized that due to the audio interface, the actual frequency is not always equal to the clock frequency of the encoder. Furthermore, the actual frequency is not even always constant, which makes the data signal very difficult to interpret.

Upon successful identification of the sentinel pattern, it is also possible to calculate the start position of the encoded data signal. According to one aspect the decoding method further comprises determining S35 a starting point of each data block based on the detected known start sequence. The start position may be used when interpreting the data.

In the fourth step the portable electronic device interprets S4 a data block succeeding the start sequence using the assessed actual frequency. Given the identified sentinel(s), the portable electronic device knows e.g. where the actual data frame starts and what frequency it is transmitted on. Depending on whether we use Manchester Encoding, Manchester Differential Encoding, or some other transmission format, the parsing proceeds accordingly from frame start. By dynamically calculating the actual clock frequency, and use it for encoding the data, it is possible to decode the signal even when the signal is corrupted.

According to one aspect of decoding an encoded data signal further comprises verifying S45 the correctness of the transmission by calculating a checksum. This variant implies that a successfully parsed frame is validated by sanity checks (length, static values, recognized command bytes and so forth) of the data protocol and checksums e.g. CRC16 or XOR. When a data frame parse is unsuccessful, it usually manifests itself as checksum errors.

As stated before, certain encoders also emit "end sentinels" in order to indicate the end of a data block. An end sentinel may be detected using the same principle.

In the fifth step the portable electronic device assesses S5 whether to request adjustment of the adjustable encoder clock frequency based on the scanning S2 and/or the interpretation S4. For example if all other candidates have been exhausted and unsuccessful, we proceed to lower the encoder's transmission frequency and retry the entire procedure. Unsuccessful implies e.g. that no known sequence was detected in step S2 or that the interpretation was unsuccessful in step S4. This may be repeated until the data is successfully decoded.

As an example, the device transmitting the encoded data is a card reader device performing an EMV payment, see www.emvco.com. During an EMV payment one long block of about 200-300 bytes is generally transmitted. The transmission of a long block may trigger the audio interface to "optimize" the signal, which may cause disturbances from the decoder point of view. This problem may be resolved by lowering the frequency. The frequency may be increased again, when signal properties have changed, e.g. after a number of successful receptions.

Even factors like air pressure, temperature or other properties and states of the phone may temporarily affect the decoding. These problems may also be solved by adjusting the encoder encoder clock frequency.

Hence, according to one aspect the step of requesting adjustment S6 of the adjustable encoder clock frequency comprises requesting an encoding device 2 to lower the adjustable encoder clock frequency if no known start sequence is detected in the data block. According to another aspect the step of requesting adjustment S6 of the adjustable encoder clock frequency comprises requesting an encoding device 2 to update the adjustable encoder clock frequency if the checksum is faulty. This may be done on request from the portable electronic device. It may also be done automatically after a predetermined time.

According to one aspect the method further comprises the step of requesting adjustment S6 of the adjustable encoder clock frequency. This is typically done by the portable electronic device sending a signal to the device.

Figure 3:
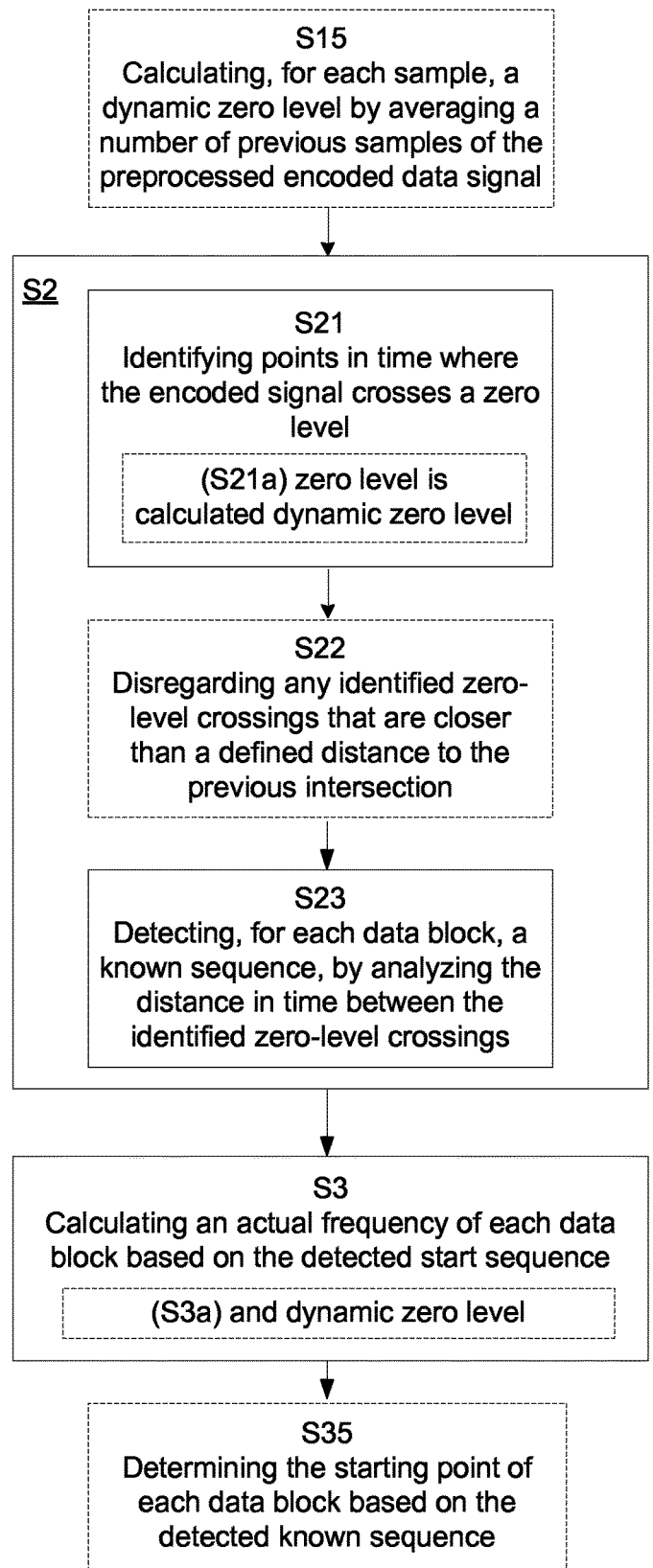
FIG. 3 discloses a flow chart of scanning of the received encoded data signal for a known start sequence in more detail.

FIG. 3 discloses exemplary embodiments showing further variants and how the different steps of the method may be implemented in more detail. When the described aspects are not dependent on each other, these variants may be implemented in any combination.

Figure 4:
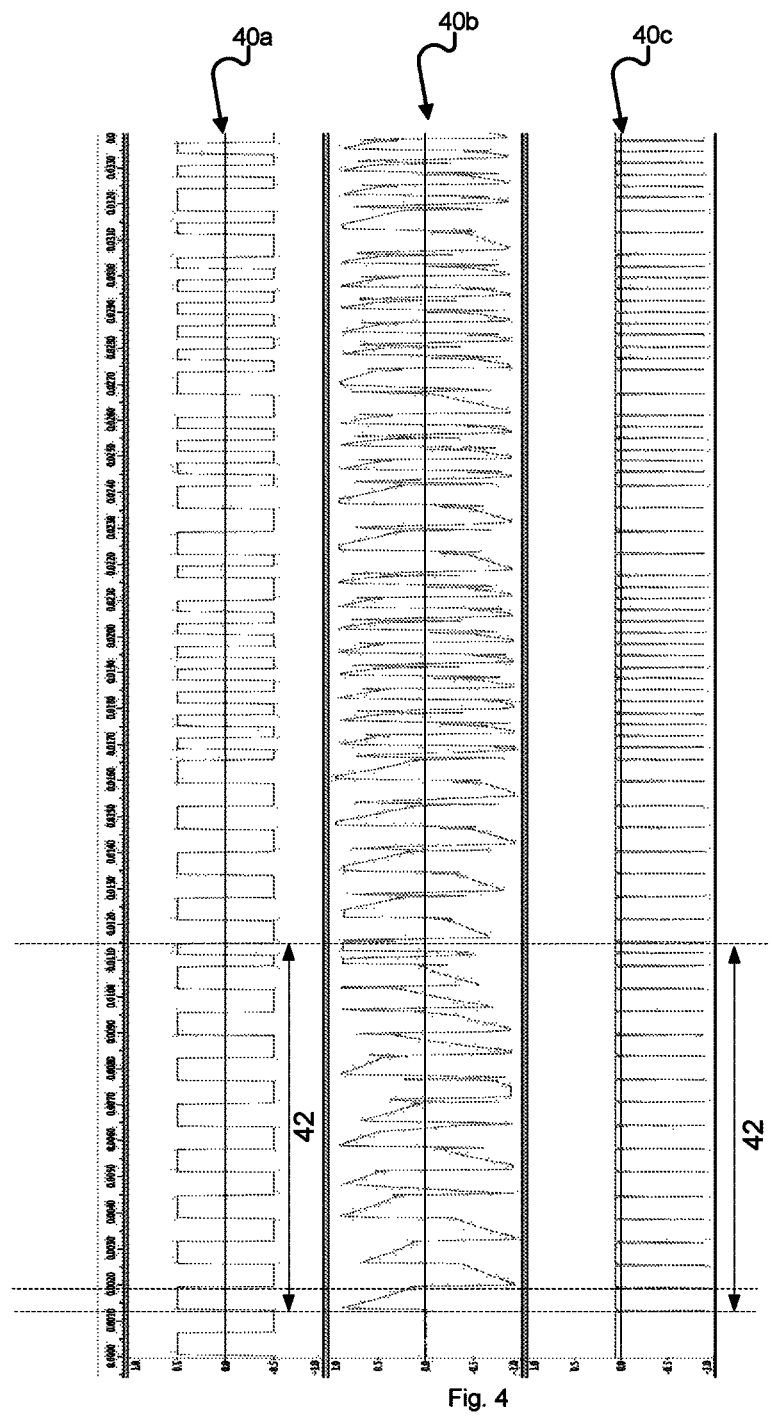
FIG. 4 shows an example of an audio signal sent from a decoding device and after passing the audio interface of a portable electronic device. The figure also shows zero crossings detected using the proposed method.

In the second step the portable electronic device scans S2 the received encoded data signal for a known start sequence, described above. According to one aspect the step of scanning S2 the received encoded data signal for a known start sequence comprises identifying S21 points in time where the encoded signal crosses the zero level of the encoded data signal and detecting S23, a known start sequence, by analyzing the distance in time between the identified zero-level crossings 41. If a dynamic zero level is calculated, as described in step S15, then the calculated zero level is typically used for the identification, S21a. From the scanning, a list of sample positions is typically given where the waveform intersects its zero level. The detection comprises e.g. iterating these zero crossings to locate a repeating pattern ("start sentinel"), which the encoders transmit before the actual data frame. There can be several candidates. This is illustrated in FIG. 4, wherein signal 40c shows the zero level crossings 41 of the original signal 40a, detected using the proposed method. Signal 40b shows the distorted signal after passing the audio interface. In signal 40a, and in FIG. 40c, the start sentinel 42 is clearly visible as the pattern of low frequencies followed by a high frequency.

According to one aspect the decoding method further comprises calculating S15, for each sample, a dynamic zero level by averaging a number of previous samples of the preprocessed encoded data signal. Then the scanning S2 of the received encoded data signal for a known start sequence and/or the calculation, S3a, of an actual frequency are based on the calculated dynamic zero level. Hence, according to this variant, even the zero level is dynamically calculated and is e.g. calculated as the average value for the last few hundred samples. Again, the number of samples that contribute to the dynamic average varies with phone model, version and other factors. The dynamic zero level is recalculated for each sample. The point of a dynamic zero-level is to avoid issues with DC offset, where certain portable electronic devices can put a high voltage on the headphone connector, which in turn offsets the encoded signal.

This is very effective because the voltage offset of the audio interface may bias the encoded signal, wherein the offset level varies over time. By calculating a dynamic zero level and using it for detecting zero level crossings, decoding of a distorted signal is possible.

According to one aspect the step of scanning S2 the received encoded data signal for a known start sequence comprises disregarding S22 any identified zero-level crossings 41 that are closer than a defined distance to the previous zero crossing. Even though smoothing may be applied in the preprocessing step, S1, according to one aspect of the disclosure, the zero crossing extraction is safeguarded by disregarding any zero crossings that are too close to the previous zero crossing.

Returning to FIG. 1, the portable electronic device 1 will now be described in further detail. The portable electronic device 1 comprises a controller, CTL, or a processing circuitry 12 that may be constituted by any suitable Central Processing Unit, CPU, microcontroller, Digital Signal Processor, DSP, etc. capable of executing computer program code. The computer program may be stored in a memory, MEM 11. The memory 11 can be any combination of a Read And write Memory, RAM, and a Read Only Memory, ROM. The memory 11 may also comprise persistent storage, which, for example, can be any single one or combination of magnetic memory, optical memory, or solid state memory or even remotely mounted memory. The portable electronic device 1 further comprises an audio interface (i/f) 10. According to one aspect the portable electronic device also comprises a wireless communication interface (i/f), 13 arranged for wireless communication with cellular communication system and/or other wireless communication systems. The wireless communication interface 13 may be adapted to communicate over one or several radio access technologies. If several technologies are supported, the access point typically comprises several communication interfaces, e.g. one WLAN communication interface and one cellular communication interface. The communication interface is e.g. adapted to download a computer program for executing the proposed methods or to access a data base comprising device specific information.

When the above-mentioned computer program code is run in the processing circuitry 12 of the portable electronic device 1, it causes the portable electronic device 1 to determine preprocess the received encoded data signal and scan the received encoded data signal for a known start sequence. When a known start sequence is successfully detected then the processing circuitry 12 further causes the device to estimate an actual frequency based on the detected start sequence, interpret, a data block succeeding the start sequence using the assessed actual frequency; and assess whether to request adjustment of the adjustable encoder clock frequency based on the scanning and/or the interpretation. The processing circuitry is further adapted to execute all the other aspects of the method as described above.

According to one aspect of the disclosure it further relates to a computer program, comprising computer readable code which, when run on a processing circuitry 12 of a portable electronic device 1, causes the portable electronic device to perform any of the aspects of the method as described above.

The invention claimed is:

1. A method, performed in a portable electronic device, of decoding an encoded data signal received at an audio interface of the portable electronic device, wherein the encoded data signal is encoded with an encoding scheme having an adjustable encoder clock frequency, the method comprising:
   pre-processing the received encoded data signal;
   scanning the received encoded data signal for a known start sequence;
   when no known start sequence is detected, requesting adjustment of the adjustable encoder clock frequency and repeating the step of scanning the received encoded data signal for a known start sequence until a known start sequence is successfully detected;
   when a known start sequence is successfully detected:
      calculating an actual frequency of the received encoded data signal based on the detected start sequence; and
      interpreting a data block succeeding the start sequence using the assessed actual frequency;
   assessing whether the interpreting of the data block was successful; and
   when interpreting the data block is unsuccessful, requesting adjustment of the adjustable encoder clock frequency.

2. The method according to claim 1, further comprising: requesting an initial adjustable encoder clock frequency.

3. The method according to claim 1, further comprising: requesting adjustment of the adjustable encoder clock frequency.

4. A method at an audio interface of the portable electronic device according to claim 3, wherein the step of requesting adjustment of the adjustable encoder clock frequency comprises requesting an encoding device to lower the adjustable encoder clock frequency if no known start sequence is detected in the data block.

5. A method at an audio interface of the portable electronic device according to claim 3, wherein the step of requesting adjustment of the adjustable encoder clock frequency comprises requesting an encoding device to update the adjustable encoder clock frequency if the checksum is faulty.

6. The method according to claim 1 wherein the step of pre-processing the encoded data signal comprises smoothing the encoded data signal.

7. A method of decoding an encoded data signal according to claim 6, wherein the step of smoothing the signal comprises applying a moving average to the encoded signal.

8. The method according to claim 1, wherein the step of pre-processing the encoded data signal comprises:
   determining an identity of the portable communication device and
   modifying the encoded data signal by applying to the encoded data signal, a set of preceding rules corresponding to the detected identity.

9. The method according to claim 8, wherein the method further comprises:
   disregarding any identified zero-level crossings that are closer than a defined distance to the previous zero crossing.

10. The method according to claim 1, wherein the step of scanning the received encoded data signal comprises:
    identifying points in time where the encoded signal crosses the zero level of the encoded data signal; and
    detecting, a known start sequence, by analyzing the distance in time between the identified zero-level crossings.

11. The method according to claim 1, further comprising:
    calculating, for each sample, a dynamic zero level by averaging a number of previous samples of the preprocessed encoded data signal; wherein the scanning of the actual frequency of each data block is based on the calculated dynamic zero level.

12. The method according to claim 1, wherein the method further comprises:
    determining a starting point of each data block based on the detected known start sequence.

13. A method at an audio interface of the portable electronic device according to claim 1, further comprising
    verifying the correctness of the transmission by calculating a checksum.

14. A method at an audio interface of the portable electronic device according to claim 1 wherein the encoded signal is Manchester encoded.

15. A method at an audio interface of the portable electronic device according to claim 1, wherein the encoded signal is encoded by a card reader device adapted to read a credit card.

16. A portable electronic device configured for decoding an encoded data signal received at an audio interface of the portable electronic device the portable electronic device comprising:
    an audio interface configured for receiving and encoded data signal encoded with an adjustable encoder clock frequency and
    processing circuitry adapted to:
       pre-process the received encoded data signal;
       scan the received encoded data signal for a known start sequence;
       when no known start sequence is detected, request adjustment of the adjustable encoder clock frequency and repeat the step of scanning the received encoded data signal for a known start sequence until a known start sequence is successfully detected;
       when a known start sequence is successfully detected;
          estimate an actual frequency of the received encoded data signal based on the detected start sequence;
          interpret, a data block succeeding the start sequence using the assessed actual frequency; and
       assess whether the interpreting of the data block was successful; and
          when interpreting the data block is unsuccessful, request adjustment of the adjustable encoder clock frequency.

17. A non-transitory computer readable medium comprising a computer program having computer readable code which, when run on a processing circuitry of a portable electronic device in a contention based communication system, causes the portable electronic device to perform the method as claimed in claim 1.

* * * * *